(12) United States Patent
Wu et al.

(10) Patent No.: US 9,101,071 B2
(45) Date of Patent: Aug. 4, 2015

(54) MAGNETIC ELEMENT HAVING IMPROVED TRANSFORMERS AND COMMON MODE CHOKES

(75) Inventors: Li-Chun Wu, Tu-Cheng (TW); Yong-Chun Xu, Kunshan (CN); Chao-Tung Huang, Tu-Cheng (TW); Chih-Min Lin, Tu-Cheng (TW); Jian-She Hu, Kunshan (CN); Kuo-Chuan Huang, Tu-Cheng (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 564 days.

(21) Appl. No.: 12/951,099

(22) Filed: Nov. 22, 2010

(65) Prior Publication Data

US 2011/0122589 A1  May 26, 2011

(30) Foreign Application Priority Data

Nov. 20, 2009  (CN) ...................... 2009 2 0315319 U

(51) Int. Cl.
| | |
|---|---|
| *H01F 27/28* | (2006.01) |
| *H05K 1/16* | (2006.01) |
| *H01R 12/52* | (2011.01) |
| *H01R 13/66* | (2006.01) |
| *H05K 1/18* | (2006.01) |

(52) U.S. Cl.
CPC ............... *H05K 1/165* (2013.01); *H01F 27/28* (2013.01); *H01F 27/2804* (2013.01); *H01R 12/526* (2013.01); *H01R 13/6633* (2013.01); *H05K 1/181* (2013.01); *H05K 2201/086* (2013.01); *H05K 2201/097* (2013.01); *H05K 2201/1003* (2013.01); *H05K 2201/1034* (2013.01); *Y10T 29/4913* (2015.01)

(58) Field of Classification Search
CPC ...................................................... H01F 27/28
USPC .......................... 336/200; 439/607.1, 620.05
See application file for complete search history.

(56) References Cited

U.S. PATENT DOCUMENTS

| | | | | |
|---|---|---|---|---|
| 5,781,091 | A * | 7/1998 | Krone et al. ................... | 336/200 |
| 6,642,827 | B1 * | 11/2003 | McWilliams et al. ......... | 336/107 |
| 6,914,509 | B2 * | 7/2005 | Yu et al. ........................ | 336/200 |
| 6,926,558 | B2 | 8/2005 | Sasai et al. | |
| 7,559,148 | B2 * | 7/2009 | Hayama ....................... | 33/355 R |
| 7,785,135 | B2 | 8/2010 | Wu | |
| 2006/0009061 | A1 * | 1/2006 | Machado et al. ............. | 439/215 |
| 2007/0015416 | A1 * | 1/2007 | Gutierrez et al. ............. | 439/676 |
| 2007/0063807 | A1 | 3/2007 | Quilici | |
| 2007/0111598 | A1 | 5/2007 | Quilici | |
| 2007/0238359 | A1 * | 10/2007 | Gutierrez et al. ......... | 439/620.01 |

(Continued)

*Primary Examiner* — Zachary M Pape
*Assistant Examiner* — Douglas Burtner
(74) *Attorney, Agent, or Firm* — Ming Chieh Chang; Wei Te Chung

(57) ABSTRACT

A magnetic element (100) includes a board unit (2) including a paddle board (21) having a row of first conductive vias (251) and a row of second conductive vias (252) for insertion of terminals (3), a number of embedded magnetic components (22), and a number of SMDs (surface mount devices) (23) mounted on the paddle board by SMT (surface mount technology). Each embedded magnetic component includes a magnetic core (221) embedded in the paddle board, and a number of PCB (printed circuit board) layout traces (222) disposed in the paddle board. Each PCB layout trace includes a first PCB layout trace (222a) encircling around the magnetic core and connecting with the first conductive via, and a second PCB layout trace (222b) encircling around the magnetic core and connecting with the SMD.

2 Claims, 4 Drawing Sheets

(56) References Cited

U.S. PATENT DOCUMENTS

| | | |
|---|---|---|
| 2008/0186124 A1 | 8/2008 | Schaffer |
| 2009/0002111 A1 | 1/2009 | Harrison |
| 2009/0176408 A1* | 7/2009 | Wu .......................... 439/607.01 |
| 2009/0253299 A1* | 10/2009 | Zhang et al. ............. 439/607.55 |
| 2010/0062645 A1 | 3/2010 | Chow et al. |

* cited by examiner

MAGNETIC ELEMENT HAVING IMPROVED TRANSFORMERS AND COMMON MODE CHOKES

CROSS-REFERENCE TO RELATED APPLICATION

This patent application is related to a pending U.S. patent application Ser. No. 12/769,686, filed on Apr. 29, 2010, and entitled "MODULAR JACK CONNECTOR HAVING IMPROVED MAGNETIC MODULE", which is assigned to the same assignee as this application.

BACKGROUND OF THE INVENTION

1. Field of the Invention

The present invention relates to a magnetic element, and more particularly to a magnetic element including transformers and CMCs (Common Mode Chokes).

2. Description of Related Art

U.S. Pat. No. 6,926,558 issued to Sasai on Aug. 9, 2005 discloses an electrical connector comprising an insulative housing, a terminal module received in the insulative housing, and a shielding shell attached to the insulative housing. The terminal module includes a paddle board, a supporting portion connecting with the paddle board, a plurality of terminals secured on the paddle board and electrically connecting with the paddle board, and a converting module including a plurality of converting terminals.

U.S. Pat. No. 7,785,135 issued to Wu on Aug. 31, 2010 discloses an electrical connector comprising an insulative housing defining a cavity, a contact module received in the insulative housing, a shielding cage mounted on the insulative housing. The contact module comprises a paddle board having a first and a second side faces, a plurality of contacts mounted at the first side face of the paddle board and electrically connected with the paddle board, a plurality of magnetic modules mounted on the second side face of the paddle board, and a converting module carrying a plurality of converting contacts mounted at the second side face of the paddle board. The paddle board has a plurality of through holes extending through the first and second side faces. The converting contacts of the converting module are inserted through the through holes. The magnetic module comprises a magnetic core and a plurality of wires winding around the magnetic core.

The magnetic module comprising such magnetic core and coils winding around the magnetic core is not well adapted for implementing automatic assembly.

U.S. Patent Application Publication No. 2008/0186124 published on Aug. 7, 2008 discloses a wire-less inductive device. The inductive device comprises a magnetic core embedded in top and bottom headers or substrates, a plurality of through-hole vias or a plurality of connecting elements disposed around the magnetic core.

U.S. Patent Application Publication No. 2007/0111598 published on May 17, 2007 discloses a receptacle assembly having a substrate and a plurality of electrical components, e.g., magnetic elements, resistive elements, capacitive elements disposed on the substrate.

Hence, an improved magnetic element is desired.

SUMMARY OF THE INVENTION

Accordingly, an object of the present invention is to provide an improved magnetic element adapted for implementing automatic assembly.

In order to achieve the object, a magnetic element in accordance with the present invention comprises an insulative housing, a board unit received in the receiving cavity and two rows of terminals. The board unit comprises a paddle board having a row of first conductive vias and a row of second conductive vias, a plurality of embedded magnetic components and a plurality of SMDs (surface mount devices) mounted on the paddle board between the row of first conductive vias and the row of second conductive vias by SMT (surface mount technology). Each embedded magnetic component comprises a magnetic core embedded in the paddle board, and a plurality of PCB (printed circuit board) layout traces disposed in the paddle board. Each of the plurality of PCB layout traces comprise a first PCB layout trace having one end encircling around the magnetic core and another end connecting with one of the first conductive vias, and a second PCB layout trace having one end encircling around the magnetic core and another end connecting with the SMD. Two rows of terminals respectively electrically connect with the row of first conductive vias and the row of second conductive vias of the paddle board for being mounted on a mother board.

The embedded magnetic components comprise the magnetic components embedded in the paddle board and PCB layout traces encircling around the magnetic cores. The embedded magnetic components are adapted for implementing automatic assembly. The SMDs are soldered on the conductive pads by SMT and are adapted for implementing automatic assembly too.

Other objects, advantages and novel features of the invention will become more apparent from the following detailed description when taken in conjunction with the accompanying drawings.

DETAILED DESCRIPTION OF THE PREFERRED EMBODIMENT

Figure 1:
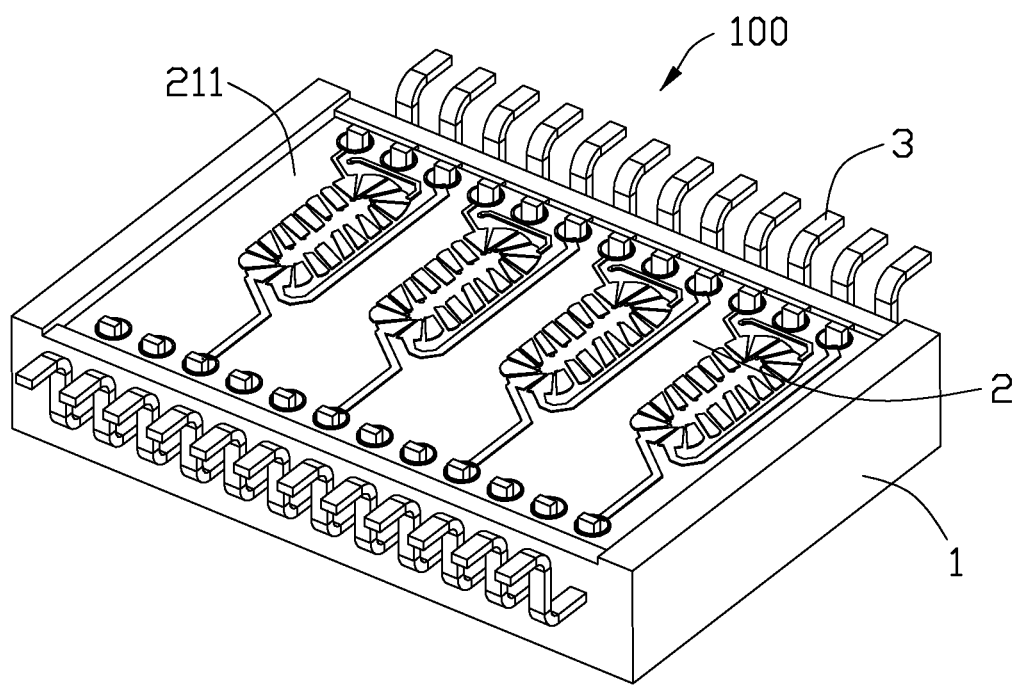
FIG. 1 is an assembled perspective view showing a magnetic element in accordance with the present invention.

Reference will now be made in detail to the preferred embodiment of the present invention. Referring to FIGS. 1-4, a magnetic element 100 comprises an insulative housing 1 defining a receiving cavity 11, a board unit 2 received in the receiving cavity 11 of the insulative housing 1, and a plurality of terminals 3 secured in the board unit 2. The magnetic element 100 could be applied in modular jack connector, LAN (local Area Network) application, or other connectors etc.

Referring to FIGS. 1-4, the insulative housing 1 includes a base portion 14, a pair of first periphery walls 12 and a pair of second periphery walls 13 rising from the base portion 14 to define the receiving cavity 11 therebetween. The base portion 14 forms two pillows 146 extending along lower ends of the second periphery walls 13. The base portion 14 has an intact bottom face 142 except for a countersink 144 at a corner thereof to mark an installation orientation when the magnetic element 100 is mounted onto a mother board (not shown).

Figure 2:
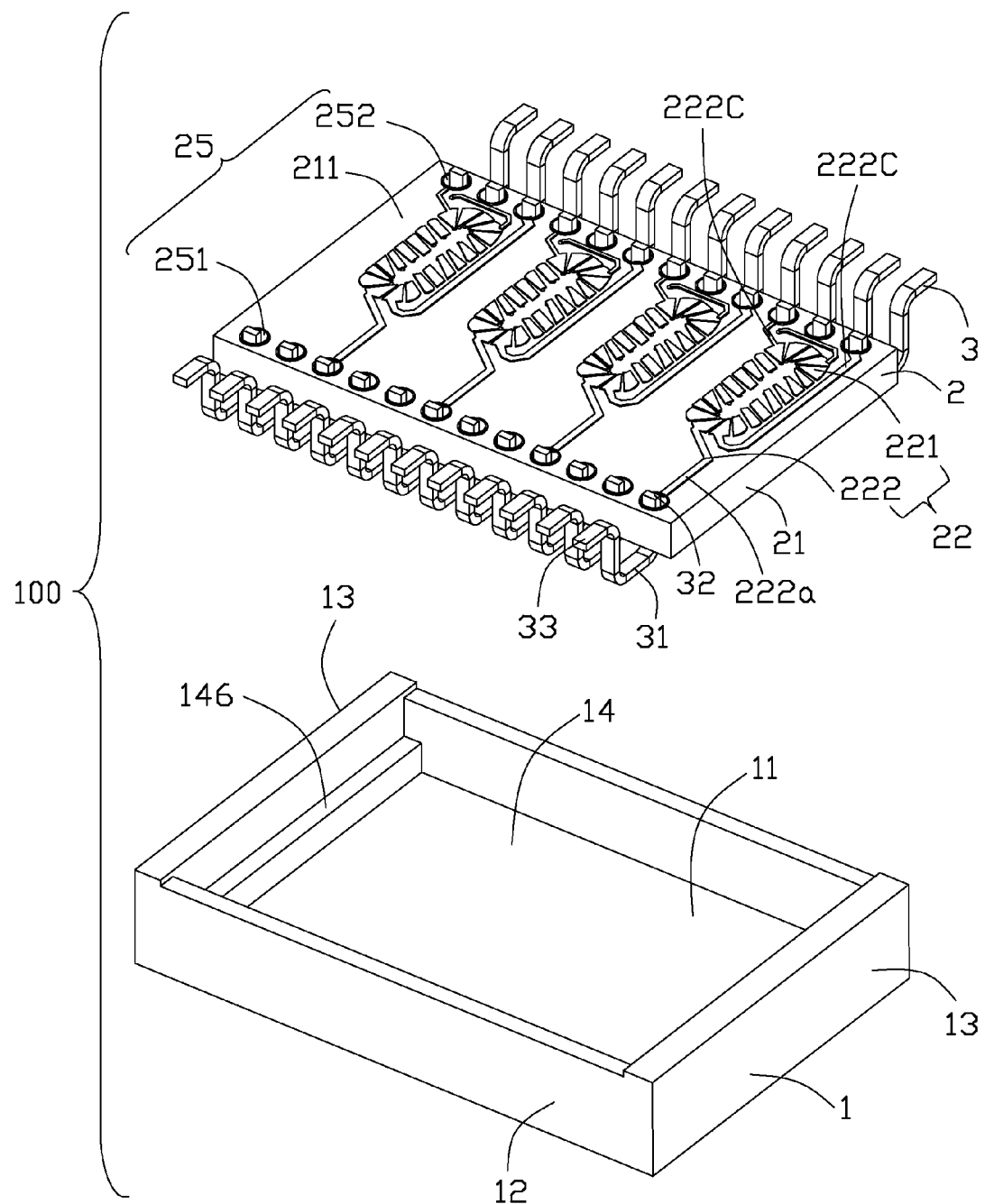
FIG. 2 is a perspective view showing a board unit and a plurality of terminals separating from the insulative housing.
Figure 3:
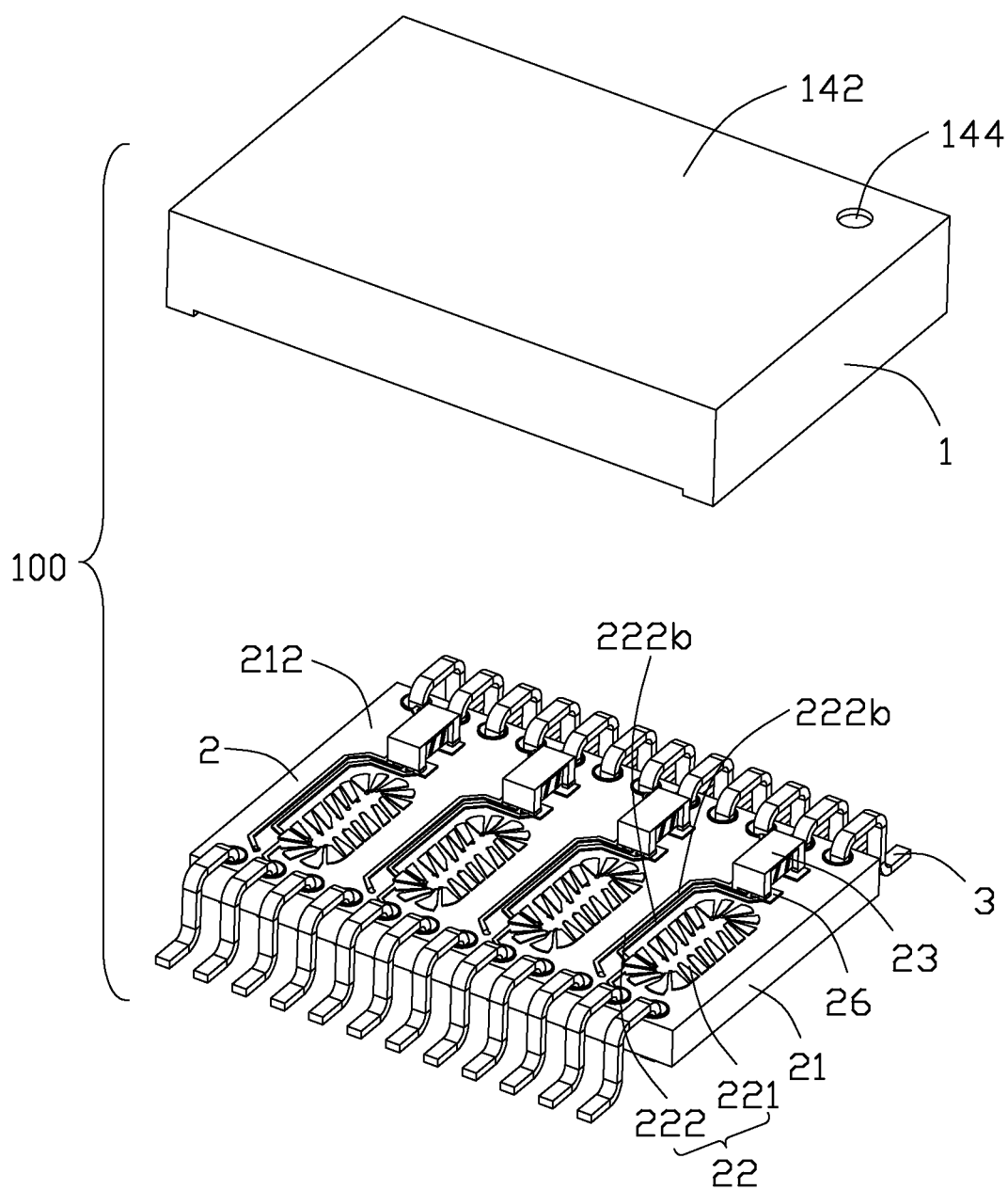
FIG. 3 is a view similar to FIG. 2, taken from another aspect.

Referring to FIGS. 2-3, the board unit 2 comprises a paddle board 21 having opposite first and second side faces 211, 212, a plurality of transformers 22 embedded in the paddle board 21, and a plurality of common mode chokes 23 mounted on the paddle board 21.

Figure 4:
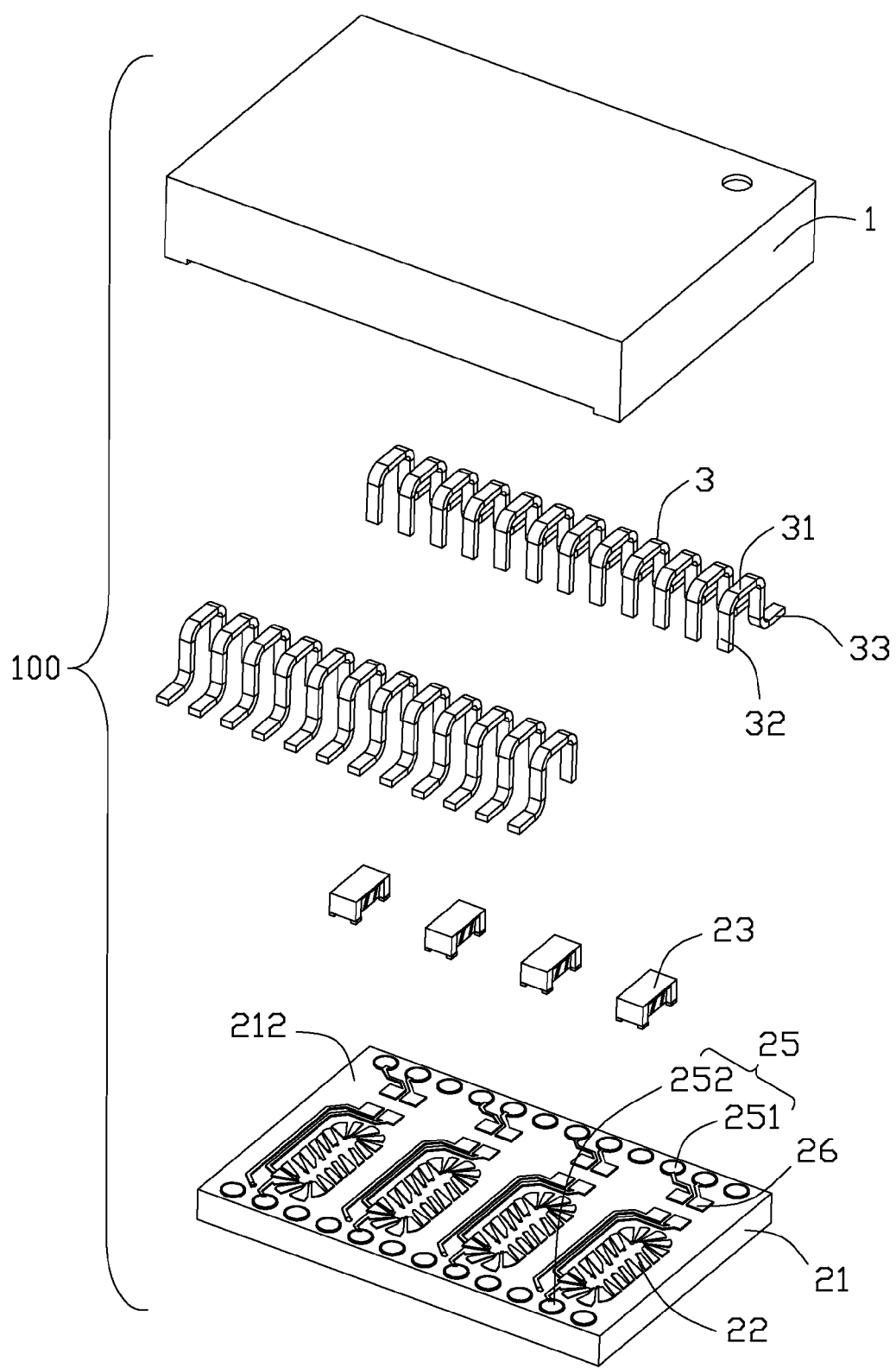
FIG. 4 is an exploded perspective view showing the magnetic element.

The paddle board 21 defines a plurality of conductive holes 25 extending through the first and second side faces 211, 212 of the paddle board 21. The conductive holes 25 comprise a first row of conductive holes 251 and a second row of conductive holes 252. Referring to FIG. 4, a plurality of conductive pads 26 are provided on the second side face 212 of the paddle board 21 and adjacent to the first row of conductive holes 251.

Each transformer 22 includes a magnetic core 221 embedded in the paddle board 21 and a plurality of PCB layout traces. The PCB layout traces include one group of PCB layout traces 222 disposed on the first and second side faces 211, 212 of the paddle board 21, and another group of PCB layout traces (not shown) embedded in the paddle board 21.

FIGS. 2 and 4 are schematic views showing the structure of the magnetic cores 221. The PCB layout traces 222 of the one group each comprise a first PCB layout trace 222a disposed in the first side face 211 of the paddle board 21, and a second PCB layout traces 222b disposed in the second side face 212 of the paddle board 21. The first PCB layout trace 222a has one end encircling around the magnetic core 221 for generating magnetic field and inductance, and another end connecting with the conductive holes 25 for realizing signal transmission and impedance coupling. The second PCB layout trace 222b has one end encircling around the magnetic core 221 and another end electrically connecting with the conductive pad 26.

Each common mode chokes 23 is made into SMD (Surface Mount Devices) choke. The common mode chokes 23 are mounted on the conductive pads 26 by SMT (Surface Mount Technology).

Each terminal 3 includes a body portion 31, a connecting portion 32 perpendicular to the body portion 31, and a soldering portion 33 bent from the body portion 31. The connecting portions 32 of the terminals 3 are inserted through the conductive holes 25. Optionally, the conductive holes 25 could be formed into other vias, with which the connecting portions 32 of the terminals 3 are soldered by soldering balls.

The board unit 2 is assembled to the insulative housing 1, with the body portions 31 of the terminals 3 mounted through the periphery walls 12 by insert-molding. The paddle board 21 is received in the receiving cavity 11 of the insulative housing 1, with the second side face 212 of the paddle board 21 facing toward the receiving cavity 11, and the first side face 211 exposed outside. The common mode chokes 23 are retained in the receiving cavity 11. The soldering portions 33 of the terminals 3 are disposed coplanar at an imaginary plane parallel with the paddle board 21. The soldering portions 33 of the terminals 3 are soldered on the mother board by SMT.

In one embodiment, the common mode chokes 23 are toroids or binoculars based.

The magnetic cores 221 of the transformers 22 are embedded in the paddle board 21. The PCB layout traces and the magnetic cores 221 are formed into the magnetic field. The transformers 22 are well adapted for implementing automatic assembly. Notably, the magnetic core 221 essentially forms a capsular configuration, in a top view, along a transverse direction, i.e., the short side of the paddle board 21.

The common mode chokes 23 are mounted on the conductive pads 26 of the second side face 212 of the paddle board 21 by SMT. The common mode chokes 23 are well adapted for implementing automatic assembly.

Notably, the magnetic cores 221 and the common mode chokes 23 are paired and aligned with each other between two rows of the conductive holes 25. The terminals 3 are arranged with plural groups each corresponding to the paired magnetic core 221 and common mode choke 23. As shown in FIGS. 1-4, in each group of the terminals 3, three terminal 3 in the first row and three terminals 3 in the second row are essentially aligned in the transverse direction and linked to the paired magnetic core 221 and common mode choke 23 wherein the three terminals 3 in the first row are electrically connected to the corresponding magnetic core 221 through the layout traces, and one of the three terminals 3 in the second row is electrically connected to the corresponding magnetic core 221 through the layout trace while two of the three terminals 3 in the second row are electrically connected to one end of the corresponding common mode choke 23 through the layout trace and the conductive pad 26 on which the common mode choke 23 is mounted. Notably, the other end of the common mode choke 23 is further electrically connected to the corresponding magnetic core 221 through the layout traces on both surfaces of the paddle board 21.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A magnetic element for being mounted onto a printed circuit board, comprising:
    an insulative housing having a base portion and two pairs of periphery walls upwardly surrounding the base portion to define a receiving cavity, the receiving cavity sealed by the base portion and the two pairs of periphery walls and having an opening facing upwardly;
    two rows of terminals respectively fixed to two of the periphery walls, each of the terminals having a body portion fixed by corresponding periphery wall, a connecting portion extending from one end of the body portion into the receiving cavity and bent upward to form a pin end, and a soldering portion connected to an opposite end of the body portion and extending outwardly to form a horizontal soldering pad;
    a board unit comprising a paddle board and a plurality of embedded transformers, each embedded transformer including a magnetic core, the paddle board having a first side face, a second side face, a row of first conductive vias, and a row of second conductive vias, the conductive vias extending through the first side face and the second side face, the transformer embedded between the first side face and the second side face and connected to the conductive vias; and
    plural SMD type common mode chokes; wherein
    the board unit is mounted into the receiving cavity through the opening and the pin ends of the terminals penetrate and are soldered in the conductive vias; and wherein
    the soldering pads of the terminals are set in a horizontal plane; and
    the first side face of the paddle board is proximal to the base portion, the common mode chokes are mounted on the first side face of the paddle board, and each embedded transformer is electrically connected with a corresponding SMD type common mode choke through the paddle board between the two rows of terminals.

2. The magnetic element as claimed in claim 1, wherein the two rows of terminals are insert-molded to the two periphery walls of said insulative housing.

* * * * *